(12) United States Patent
Williams et al.

(10) Patent No.: US 9,042,094 B2
(45) Date of Patent: May 26, 2015

(54) INSERTION AND REMOVAL ASSEMBLY FOR INSTALLING AND REMOVING DATA STORAGE DRIVES IN AN ENCLOSURE

(71) Applicant: SANMINA CORPORATION, San Jose, CA (US)

(72) Inventors: David Williams, El Paso, TX (US); Kevin Alan Patin, El Paso, TX (US); Brian Nichols, San Jose, CA (US); Paul Amdahl, San Jose, CA (US)

(73) Assignee: Sanmina Corporation, San Jose, CA (US)

( * ) Notice: Subject to any disclaimer, the term of this patent is extended or adjusted under 35 U.S.C. 154(b) by 151 days.

(21) Appl. No.: 13/782,911

(22) Filed: Mar. 1, 2013

(65) Prior Publication Data

US 2013/0229766 A1    Sep. 5, 2013

Related U.S. Application Data

(60) Provisional application No. 61/605,272, filed on Mar. 1, 2012.

(51) Int. Cl.
| | |
|---|---|
| *H05K 5/00* | (2006.01) |
| *H05K 7/00* | (2006.01) |
| *G06F 1/16* | (2006.01) |
| *H05K 7/14* | (2006.01) |
| *G11B 33/00* | (2006.01) |
| *G11B 33/12* | (2006.01) |
| *G06F 1/18* | (2006.01) |

(52) U.S. Cl.
CPC ............... *G06F 1/16* (2013.01); *H05K 5/0026* (2013.01); *H05K 7/1461* (2013.01); *G11B 33/00* (2013.01); *G11B 33/128* (2013.01); *G06F 1/187* (2013.01)

(58) Field of Classification Search
USPC .......................... 361/679.37, 679.38, 679.39
See application file for complete search history.

(56) References Cited

U.S. PATENT DOCUMENTS

| | | | | |
|---|---|---|---|---|
| 7,355,846 | B1 * | 4/2008 | Chen et al. ............... | 361/679.33 |
| 7,639,490 | B2 * | 12/2009 | Qin et al. ................. | 361/679.34 |
| 7,656,657 | B2 * | 2/2010 | Grady et al. ............. | 361/679.37 |
| 8,369,081 | B2 * | 2/2013 | Chen ......................... | 361/679.39 |
| 8,411,429 | B2 * | 4/2013 | Li .............................. | 361/679.33 |
| 8,456,832 | B1 * | 6/2013 | Brigham et al. ......... | 361/679.35 |
| 8,508,928 | B2 * | 8/2013 | Killen et al. ............. | 361/679.33 |

(Continued)

FOREIGN PATENT DOCUMENTS

RU            108199 U1      9/2011

*Primary Examiner* — Anthony Haughton
(74) *Attorney, Agent, or Firm* — Loza & Loza, LLP; Julio M. Loza

(57) ABSTRACT

An insertion and removal assembly for installing and removing hard drives from an enclosure, such as a computer chassis, is provided. The insertion and removal assembly includes a sliding member configured to receive a hard drive, a lever handle rotatably connected to the sliding member and an attachment wall having a plurality of protrusions defining a plurality of slots, each slot configured to receive one sliding member. A user reveals a slot for accepting the installation of the hard drive in the enclosure by pushing a tab on the attachment wall near a distal portion of the lever handle to release the lever handle and then pulling the lever handle outward exposing the sliding member. A hard drive is inserted into the sliding member and pushed inwardly into the chassis. Conversely, the sliding member can contain a hard drive which is partially ejected by unlatching and subsequently pulling the lever.

22 Claims, 8 Drawing Sheets

(56) References Cited

U.S. PATENT DOCUMENTS

2003/0030993 A1    2/2003    Kitchen et al.
2012/0087084 A1*    4/2012    Nguyen et al. ........... 361/679.37
2012/0113583 A1*    5/2012    Peng et al. ............... 361/679.39

\* cited by examiner

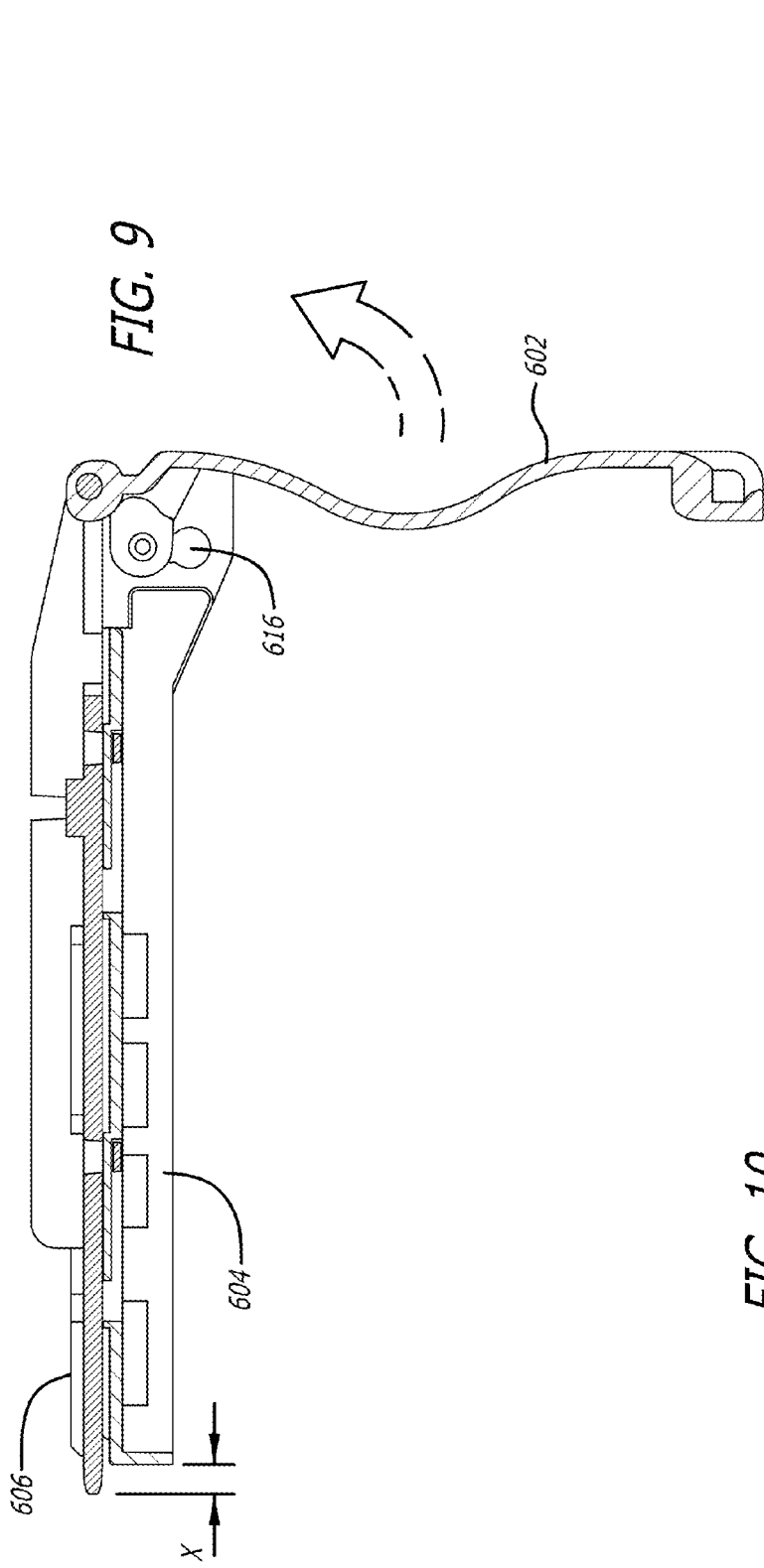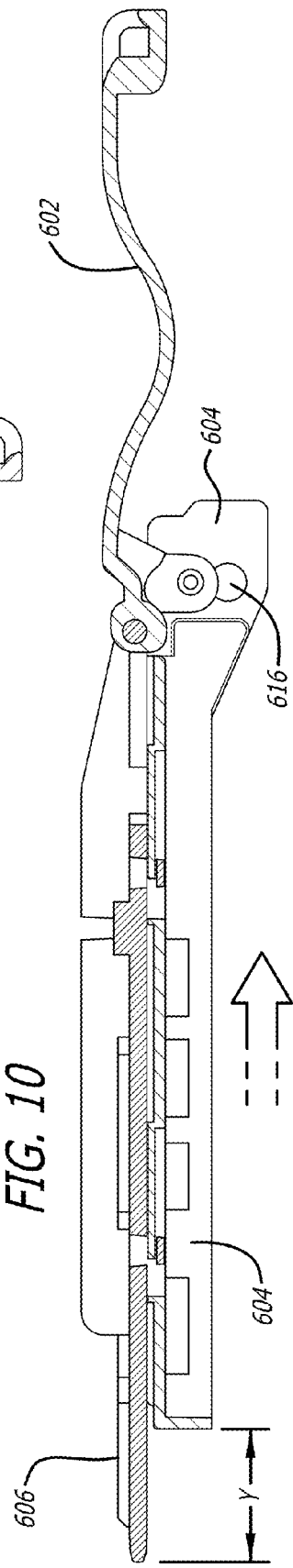

INSERTION AND REMOVAL ASSEMBLY FOR INSTALLING AND REMOVING DATA STORAGE DRIVES IN AN ENCLOSURE

CLAIM OF PRIORITY

The present Application for Patent claims priority to U.S. Provisional Application No. 61/605,272 entitled "Carrier-Less Drive Mounting and Ejection for a Computer Chassis", filed Mar. 1, 2012, which is hereby expressly incorporated by reference.

FIELD

Various features relate to improvements to computer hardware, and more particularly, to installing and removing data storage drives or other components in an enclosure, such as a computer chassis.

BACKGROUND

Information handling systems (generally referred to herein as "computers") exist in many forms, from pocket-sized devices, cellular phones, and the like, to personal computers, servers, rack-mounted systems and mainframes. The manufacture and assembly of computers generally involves the mounting of computer hardware, computer devices, modular components and the like (generally referred to herein as "computer assemblies"), into the computer. Personal computers, servers, and the like, generally include one or more computer assemblies, such as computer drives for storing or accessing information. Such computer drives will often include so-called data storage drives which are added for the primary purpose of storing electronic information in the computer.

The installation of computer assemblies, in particular the data storage drives referred to above, can be a time consuming and tedious task and may require first adding various carrier assemblies, bracket assemblies, and the like, to the drive in order to mount the drive into the computer. Attaching such carrier or bracket assemblies to a drive will typically require additional fastening hardware. For example, the drive has threaded holes for which a carrier assembly or bracket assembly may be attached with screws or other fastening hardware. The combined drive and carrier assembly can then be mounted to a computer chassis. The need to add such carrier assembly to the drive prior to being able to install the drive into the computer chassis requires added time and parts to manufacture the computer.

Therefore, it may be desirable to provide a device or method for reducing the time and possibly reducing the number of computer parts required for installation of a computer assembly, such as a data storage drive, into a computer.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, an insertion and removal assembly for installing and removing components from an enclosure is provided. The insertion and removal assembly comprises at least one sliding member, having an upper end and a lower end, configured to receive a computer component; at least one lever handle having a pivot end and a distal end, the pivot end rotatably connected to the at least one sliding member; and an attachment wall having a plurality of protrusions defining a plurality of slots, each slot configured to receive one sliding member from the at least one sliding member, where the at least one sliding member is moveable between a first sliding position and a second sliding position. Each slot on the attachment wall is defined by a first pair of protrusions in the plurality of protrusions and a second pair of protrusions in the plurality of protrusions, where the first pair of protrusions is offset from the second pair of protrusions.

In one aspect, the at least one sliding member comprises a bottom having a first length; a first sidewall having a second length, the second length greater than the first length; and a second sidewall having a third length, the third length shorter than the first length; and an end plate, wherein the bottom, the first sidewall, the second sidewall and the end plate being integrally connected.

In one aspect, the first sidewall includes a first end integrally connected to the end plate and a second end having an elongated lever handle groove adapted to receive a pivot pin located on the pivot end of the lever handle, the pivot pin adapted to rotate with the lever handle from a first position to a second position. The end wall of the sliding member is located a first distance from a bottom portion of the attachment wall when in the first sliding position; the end wall of the sliding member is located a second distance from the bottom portion of the attachment wall when in the second sliding position; and wherein the second distance is greater than the first distance.

In one aspect, the bottom of the sliding member includes a first pair of elongated grooves adapted to receive the first pair of protrusions and a second pair of elongated grooves adapted to receive the second pair of protrusions. Each protrusion in the first pair of elongated protrusions and the second pair of elongated protrusions has a first portion extending perpendicularly outward from the attachment wall and a second portion extending perpendicularly outward from the first portion, parallel to the attachment wall.

In one aspect, the insertion and removal assembly further comprises a fastening mechanism operable between a locked position and an unlocked position, the fastening mechanism comprising a latching protrusion integrally connected to and extending outwardly from the distal end of the at least one lever handle; and a latching hole integrally formed within a top portion of the attachment wall and adapted to capture the latching protrusion when in the locked position.

In one aspect, the top portion of the attachment wall includes a latching tab extending above the latching hole; wherein applying pressure to the latching tab when the fastening mechanism is in the unlocked position causes the top portion of the attachment wall to flex outwards and then back capturing the latching protrusion within the latching hole; and wherein applying pressure to an adjacent tab on the top portion of the attachment wall when the fastening mechanism is in the locked position causes the top portion of the attachment wall to flex outwards releasing the latching protrusion from the latching hole.

In one aspect, pressing the adjacent tab of the attachment wall when the fastening mechanism is in the locked position causes the at least one lever handle to spring outward; rotating the at least one lever handle causes the sliding member to move from the first sliding position to the second sliding position; and wherein when the sliding member is in the second sliding position, the computer component is partially ejected.

In one aspect, moving the lever handle from the second position to the first position causes the sliding member to slide inward into a slot.

In one aspect, the at least one lever handle has a curvature for contacting and applying a specific force to a surface of the computer component.

According to another feature, an enclosure for a storage unit is provided. The enclosure comprises a bottom plate; a pair of side plates; a pair of end plates, the bottom plate, the pair of side plates and the pair of end plates being integrally connected; one or more printed circuit boards connected to and extending perpendicularly from at least one of the bottom plate, the pair of side plates and the pair of end plates; and one or more insertion and removal assemblies, for installing and removing components from the enclosure, connected to and extending perpendicularly from the one or more circuit boards. Each of the one or more insertion and removal assemblies comprises at least one sliding member, having an upper end and a lower end, configured to receive a computer component; at least one lever handle having a pivot end and a distal end, the pivot end rotatably connected to the at least one sliding member; and an attachment wall having a plurality of protrusions defining a plurality of slots, each slot configured to receive one sliding member from the at least one sliding member; where the at least one sliding member is moveable between a first sliding position and a second sliding position. Each slot on the attachment wall is defined by a first pair of protrusions in the plurality of protrusions and a second pair of protrusions in the plurality of protrusions.

In one aspect, the at least one sliding member comprises a bottom having a first length; a first sidewall having a second length, the second length greater than the first length; a second sidewall having a third length, the third length shorter than the first length; and an end plate, wherein the bottom, the first sidewall, the second sidewall and the end plate being integrally connected.

In one aspect, the first side wall includes a first end integrally connected to the end plate and a second end having an elongated lever handle groove adapted to receive a pivot pin located on the pivot end of the at least one lever handle, the pivot pin adapted to rotate the at least one lever handle from a first position to a second position; wherein the bottom includes a first pair of elongated grooves adapted to receive the first pair of protrusions and a second pair of elongated grooves adapted to receive the second pair of protrusions; and wherein each protrusion in the first pair of elongated protrusions and the second pair of elongated protrusions has a first portion extending perpendicularly outward from the attachment wall and a second portion extending perpendicularly outward from the first portion, parallel to the attachment wall.

In one aspect, each of the one or more insertion and removal assemblies further comprises a fastening mechanism operable between a locked position and an unlocked position. The fastening mechanism comprises a latching protrusion integrally connected to and extending outwardly from the distal end of the at least one lever handle; and a latching hole integrally formed within a top portion of the attachment wall and adapted to capture the latching protrusion when in the locked position.

In one aspect, the top portion of the attachment wall includes a latching tab extending above the latching hole; and wherein applying pressure to the latching tab when the fastening mechanism is in the unlocked position causes the top portion of the attachment wall to flex outwards and then back capturing the latching protrusion within the latching hole.

In one aspect, applying pressure to an adjacent tab on the top portion of the attachment wall when the fastening mechanism is in the locked position causes the top portion of the attachment wall to flex outwards releasing the latching protrusion from the latching hole.

In one aspect, the at least one lever handle has a curvature for contacting and applying a specific force to a surface of the computer component.

BRIEF DESCRIPTION OF THE DRAWINGS

FIG. 9 illustrates a cross-sectional view of the insertion and removal assembly, in a first position, taken along line 9-9 of FIG. 8.

FIG. 10 illustrates the insertion and removal assembly of FIG. 9 in a second position.

DETAILED DESCRIPTION

Figure 1:
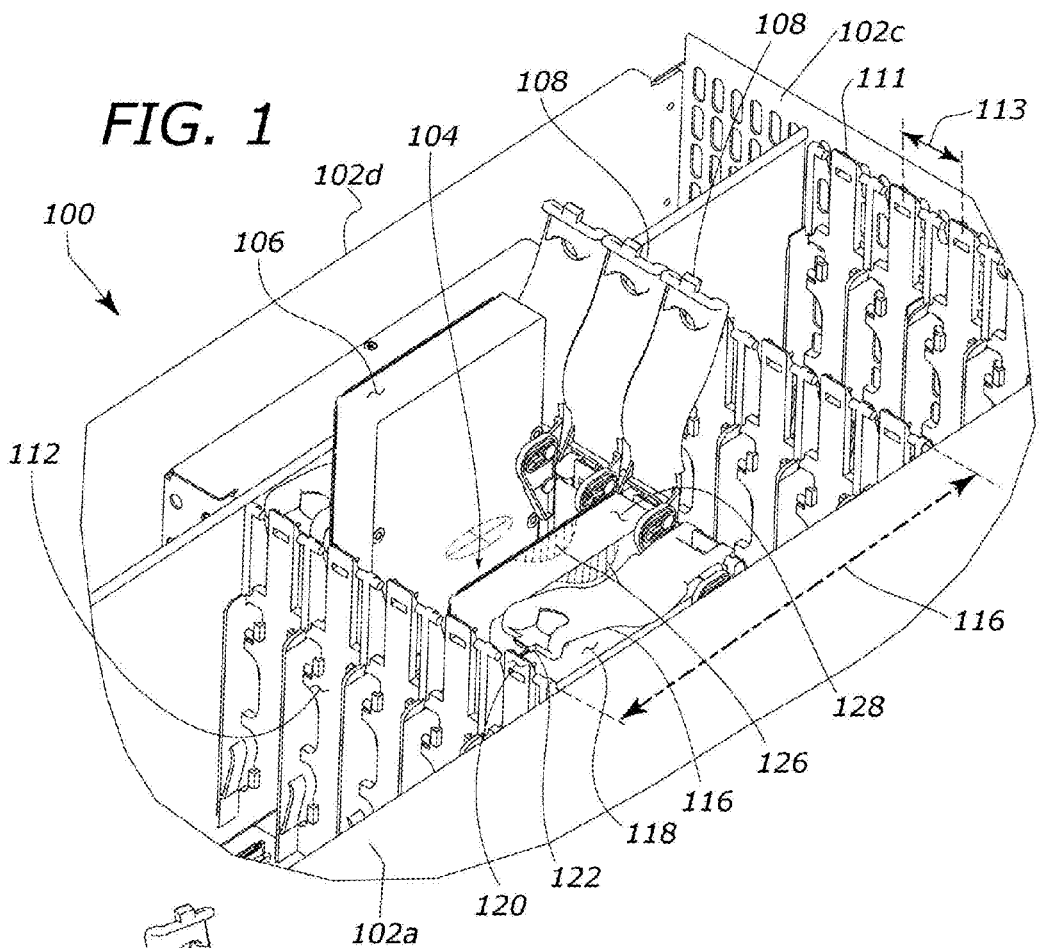
FIG. 1 illustrates a partial internal view of an enclosure having an insertion and removal assembly, according to one embodiment.

In the following detailed description, numerous specific details are set forth in order to provide a thorough understanding of the embodiments. However, it will be understood by one of ordinary skill in the art that the embodiments may be practiced without these specific details. For example, operations may be shown in block diagrams, or not be shown at all, in order not to obscure the embodiments in unnecessary detail. In other instances, well-known operations, structures and techniques may not be shown in detail in order not to obscure the embodiments.

In the following description, certain terminology is used to describe certain features of one or more embodiments. The term "rack" may refer to any type of frame-like structure adapted to hold and display equipment.

The term "data storage drive" may refer to a hard disk drive, a solid state drive or any type of drive for storing data. The term "fastener" or "fastening member" may refer to any type of device for connecting metal, plastic and other materials in common hardware construction, including screws, bolts, nuts, washers, rivets, cotter pins, clevis pins, studs, threaded rods and other mechanical connectors. The term "hole" may refer to any opening through a structure and/or component or a hollowed-out place in a structure and/or component, including apertures, bores, cavities, chambers, grooves, notches, passages, slits and slots. The term "protrusion" may refer to objects or parts projecting in an outward manner from a structure and/or component.

According to one aspect, an insertion and removal assembly may be located within a computer chassis (or enclosure) for facilitating the installation and removal of a data storage drive. The insertion and removal assembly may include a sliding member configured to receive a data storage drive, a lever handle, rotatably connected to the sliding member and an attachment wall having a plurality of protrusions defining a plurality of slots, each slot configured to receive one sliding member.

According to one aspect, a user can reveal a slot for accepting the installation of the data storage drive in the enclosure by moving or pushing a latching tab, near a distal end of the lever handle, to release the lever handle and then pulling the lever handle outward exposing the sliding member. A data storage drive may be inserted into the sliding member and pushed inwardly into the chassis. Each slot has features which provide a means of guiding the data storage drive upon installation into the slot and holding it in the enclosure for proper functionality.

According to one aspect, the lever handle may have a curvature for both securing the data storage drive in the enclosure and applying a particular force within a range of forces which is desirable for the computer functionality. The curvature of the lever handle may act as a spring, contacting and applying a specific force to the data storage drive. The spring force may accommodate for variations and differences in the length of the data storage drives.

According to one aspect, a user may remove the data storage drive from an enclosure by moving or pushing a latching tab, near a distal end of the lever handle, with a finger, thereby releasing the lever handle, and moving the lever handle to a second position, whereby the action of the lever handle against the sliding member partially ejects the data storage drive a prescribed distance from the enclosure. The user may then fully remove the data storage drive from within the enclosure.

Figure 2:
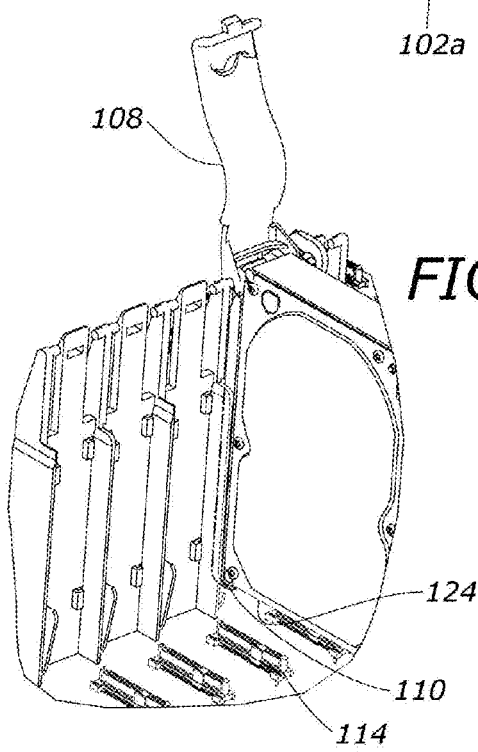
FIG. 2 illustrates a partial internal view of an insertion and removal assembly in an enclosure, according to one embodiment.
Figure 3:
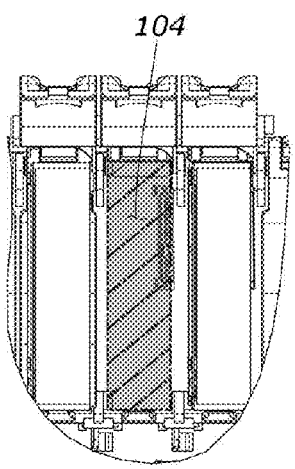
FIG. 3 illustrates a partial top plan view showing a slot in the insertion and removal assembly of FIG. 1.

FIG. 1 illustrates a partial internal view of an enclosure 100 having an insertion and removal assembly, according to one embodiment. FIG. 2 illustrates a partial internal view of an insertion and removal assembly in an enclosure, according to one embodiment. FIG. 3 illustrates a partial top plan view showing an aperture (or slot) in the insertion and removal assembly of FIG. 1. The following discussion refers interchangeably to features FIGS. 1-3.

The enclosure 100 may include a bottom plate 102a integrally connected to a pair of side plates (not shown) and a pair of end plates 102c. A top plate 102d may be integrally connected to the pair of side plates and the pair of end plates 102c forming the enclosure 100. The enclosure 100 may be pulled out of the rack mount type storage unit for loading/replacing/repairing data storage drives and then pushed back into the rack.

The internal components of the enclosure 100 may be secured to the bottom plate 102a and include one or more columns of slots 104 configured for receiving a plurality of data storage drives 106. In FIG. 1, three columns of slots are shown with one of the columns having a data storage drive received within each of the slots. Although each column is shown having five (5) slots, this is by way of example only. The enclosure may be designed to have more than five (5) slots in a column or fewer than five (5) slots in a column.

Each of the slots may include an insertion and removal assembly comprising a lever handle 108 rotatably connected to a sliding member 110 which act together to manipulate a data storage drive 106 out of, or install within, the slot in the enclosure.

Multiple slots may exist within an enclosure by use of a repeating pattern of slot walls such that each wall 111 contains a repeating pattern of features 112 in one dimension 113. Additionally a multitude of walls may be placed in a repeated pattern in a second dimension 116 within the enclosure. A data storage drive 106 may be installed into a slot 104 in the enclosure after the lever handle 108, located relative to the same slot 104, is released and lifted to a position which opens the slot 104. A user may install the data storage drive 106 into an open slot 104 by hand, pushing the data storage drive 106 downward into the slot 104.

At a point which the data storage drive 106 contacts the end wall of the sliding member 110, the related lever handle 108 may begin to close towards the data storage drive 106 and in a motion both capture it and close the slot 104. At this point, the user may continue to install the data storage drive 106 into the enclosure by moving or rotating the lever handle 108 in a downward motion so it contacts the data storage drive 106, capturing it and closing the slot 104. In this continued motion, the data storage drive 106 will connect with a related data storage drive mating connector 114 within the enclosure until its motion is stopped by the connector 114 and the data storage drive 106 will no longer move.

The lever handle 108 may rest on the related contacting surface of the data storage drive 118 and the data storage drive 118 will be captured by the user continuing to push the lever handle 108 at a general location 116 near the distal (or latching) end of the lever handle 108, until a latching tab 120, comprised of portion of the side wall of the slot, flexes away from the lever handle 108 and then back to capture the latching hook 122 at the same end of the lever handle 108.

In a reversal of installation, the data storage drive may be quickly removed from the enclosure by the user by first pushing against the latching tab 120 thereby releasing the lever handle 108. A further lifting motion of the lever handle 108 may act against the sliding member 110, which in turn, acts against the related surface 124 of the data storage drive ejecting it out of the slot 104 in the enclosure by a prescribed distance. Once the lever handle 108 is moved to the extent of its travel as allowed by the interaction of the lever handle 108, sliding member and walls of the open slot, the user may handle the exposed area 126 of the data storage drive 128 with two fingers to pull the drive completely from the slot of the enclosure.

According to one aspect, the lever handle 108 may include a curvature or concave groove which contacts and applies a specific force to a surface of the data storage drive 118. The data storage drive 118 may then be captured by the user continuing to push the lever handle 108 at a general location 116 near the distal (or latching) end of the lever handle 108, until a latching tab 120, comprised of portion of the side wall of the slot, flexes away from the lever handle 108 and then back to capture the latching hook 122 at the same end of the lever handle 108.

The spring force may accommodate for variations and differences in the length of the data storage drives. Applying the spring force to the data storage drive allows for the data storage device to maintain good contact between a drive connector located on the data storage device with a corresponding mating receptacle on a printed circuit board within the enclosure. Additionally, if the data storage drive is a rotational drive (i.e. a hard drive), the spring force applied by the lever handle 108 may reduce vibration within the drive which is a result of the disc rotation and the acceleration of the READ/WRITE Head armature. Vibration can cause the head to mis-track and when the head is knocked off-track it must retry the READ or WRITE operation which results in performance loss. Multiple retries cause very poor data throughput speeds and enough retries can cause the drive to fail.

Figure 4:
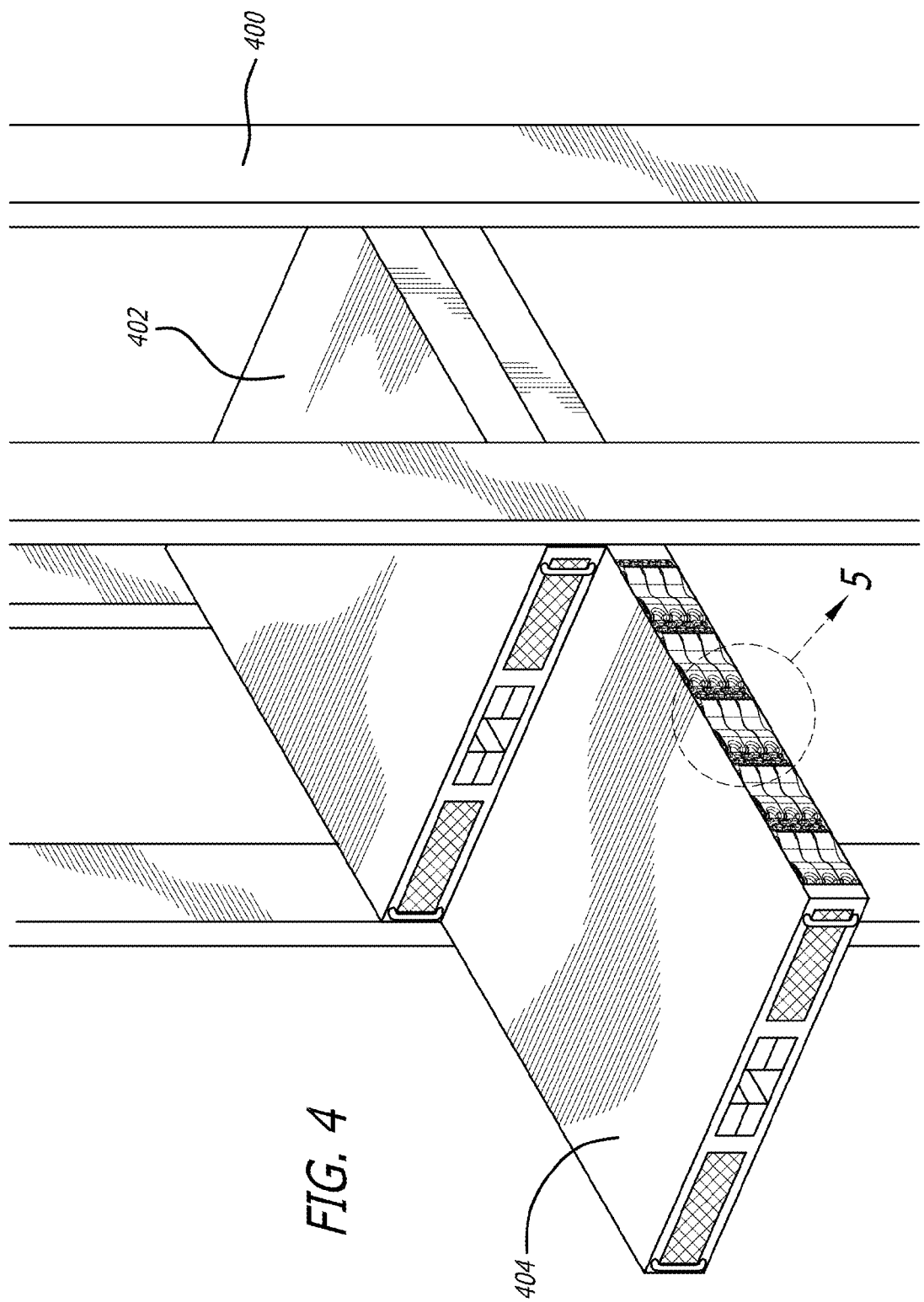
FIG. 4 illustrates a side perspective view of enclosures for a rack mount type storage unit, according to one embodiment.
Figure 5:
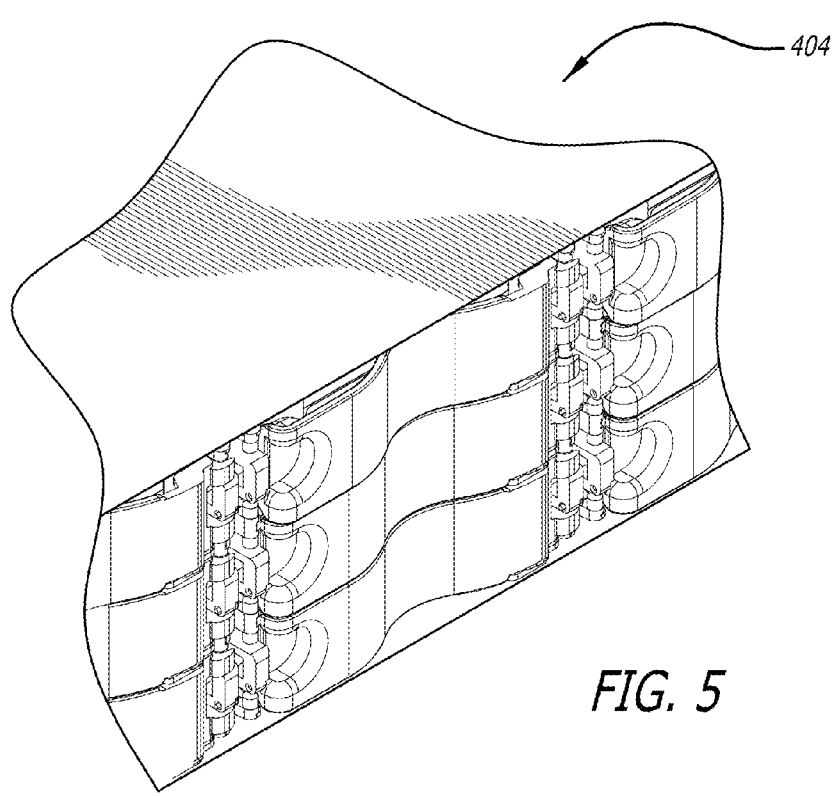
FIG. 5 illustrates the enlarged Detail 5 of FIG. 4 showing a stack of hard drives.

FIG. 4 illustrates a side perspective view of a rack mount type storage unit 400, according to one embodiment. As shown, the rack mount type storage unit 400 has two (2) enclosures 402, 404. This is by way of example only and the storage unit may have more than two (2) enclosures. A side panel has been removed from enclosure 404 showing five (5) columns of three (3) stacked data storage drives. Although the enclosure is shown having five (5) data storage drive columns, this is by way of example only. The enclosure may be designed to have more than five (5) columns of data storage drive slots or fewer than five (5) columns of data storage drive slots. Additionally, although the each column is shown having three (3) data storage drive slots, this is by way of example only. Each column may be designed to have more than three (3) data storage drive slots or fewer than three (3) data storage drive slots. FIG. 5 illustrates the enlarged Detail 5 of FIG. 4 showing a stack of data storage drives.

As described above, an enclosure may include a bottom plate integrally connected to a pair of side plates and a pair of end plates. A top plate may be integrally connected to the pair of side plates and the pair of end plates forming the enclosure. In one aspect, one or more printed circuit boards may be connected to and extend perpendicularly from at least one of the bottom plate, the pair of side plates and the pair of end plates of the enclosure. The one or more printed circuit boards may include one or more connectors adapted to connect the one or more printed circuit boards to one or more data storage drives.

Figure 6:
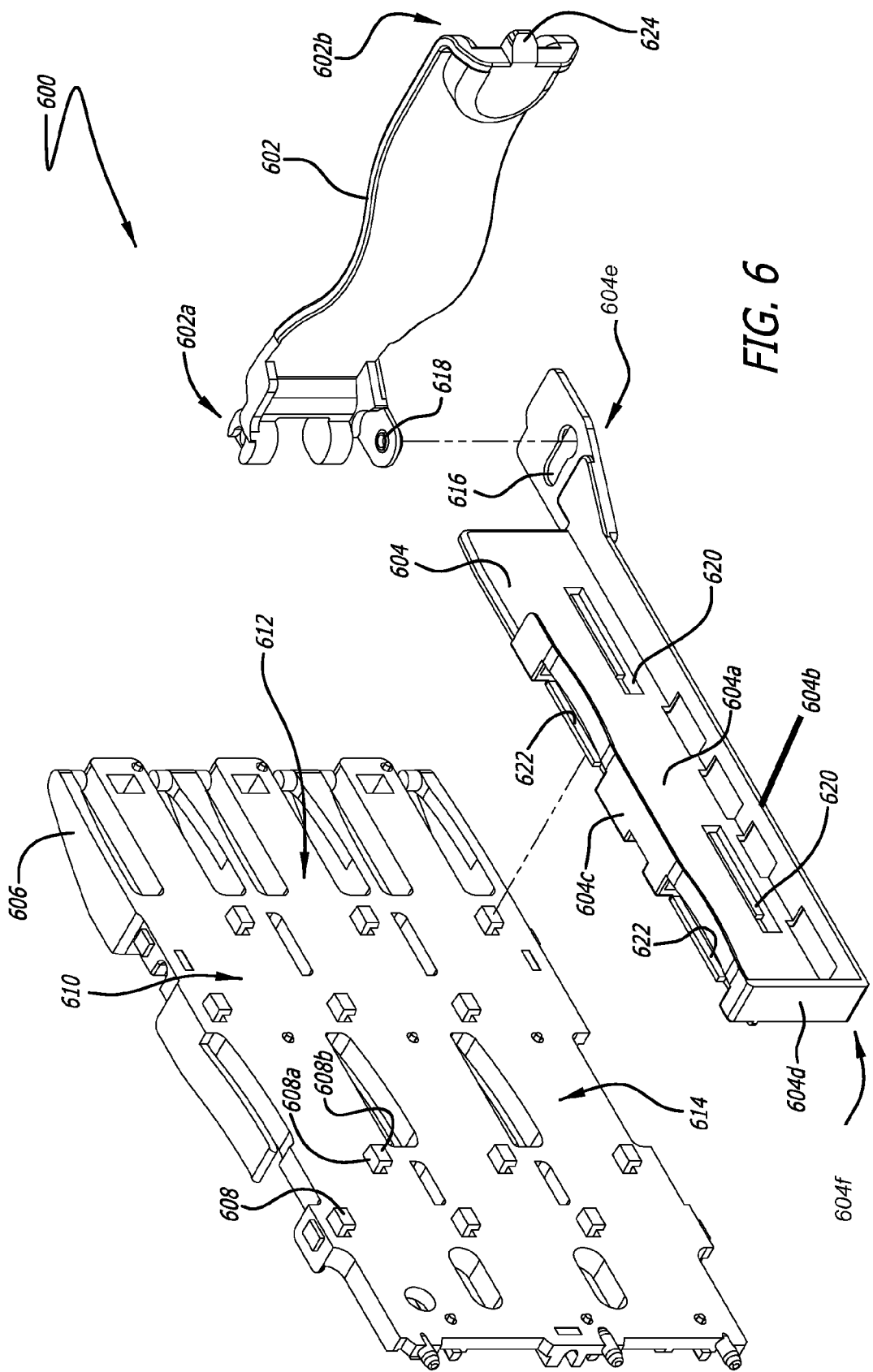
FIG. 6 illustrates an exploded view of an insertion and removal assembly, according to one embodiment.
Figure 7:
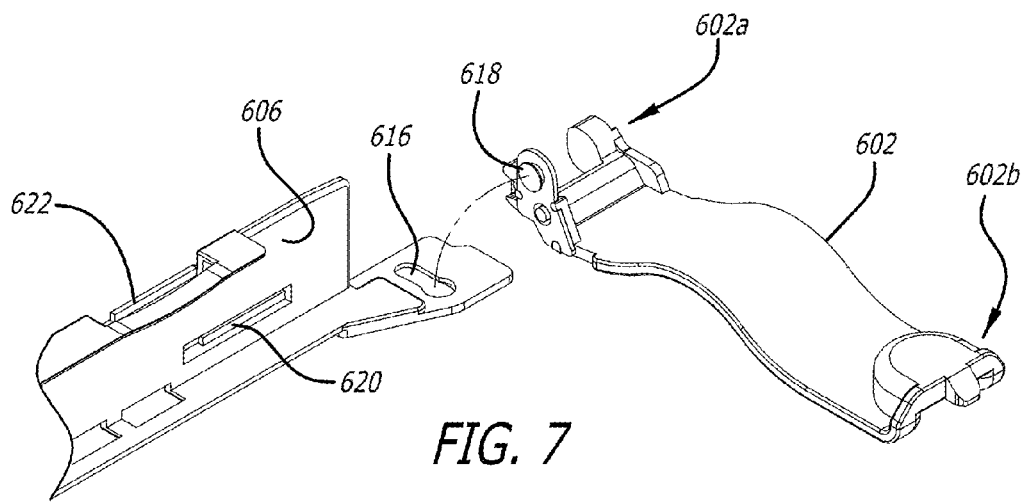
FIG. 7 illustrates a close up view of an attaching mechanism for a lever handle and sliding member of the insertion and removal assembly of FIG. 6.
Figure 8:
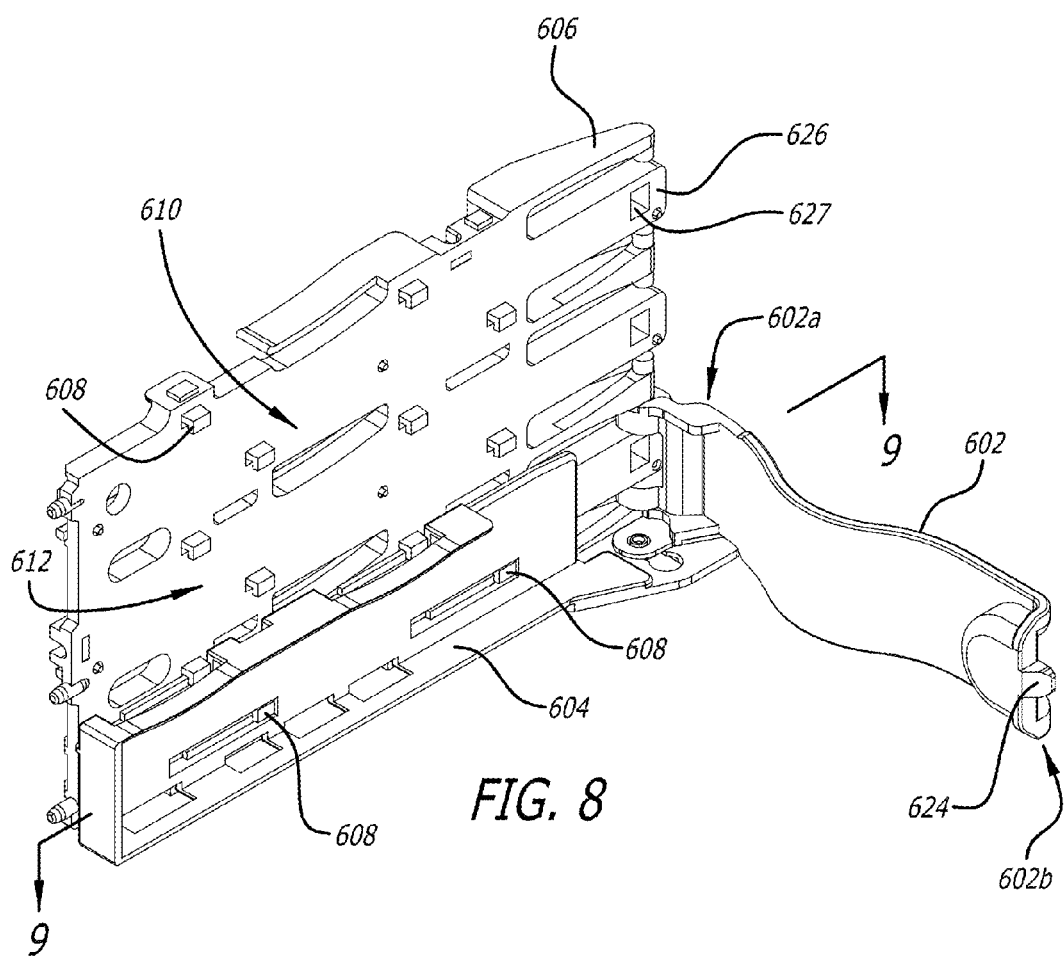
FIG. 8 illustrates a perspective assembled view of the insertion and removal assembly of FIG. 6.
Figure 11:
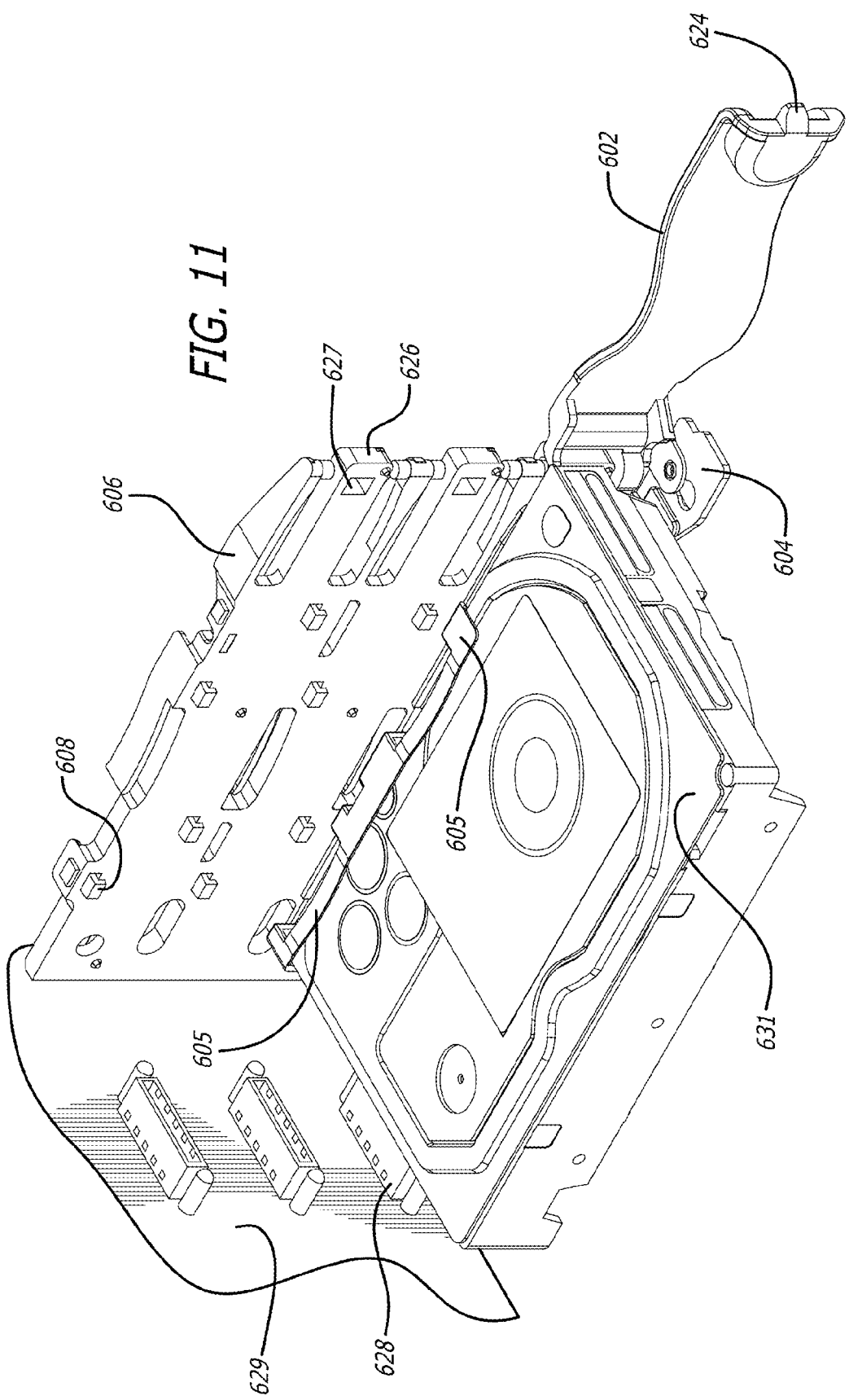
FIG. 11 illustrates a partial internal view of an insertion and removal assembly in an enclosure for a rack mount type storage unit, according to one embodiment.

FIG. 6 illustrates an exploded view of an insertion and removal assembly, according to one embodiment. FIG. 7 illustrates a close up view of an attaching mechanism for a lever handle and sliding member of the insertion and removal assembly of FIG. 6. FIG. 8 illustrates a perspective assembled view of the insertion and removal assembly of FIG. 6. FIG. 9 illustrates a cross-sectional view of the insertion and removal assembly, in a first position, taken along line 9-9 of FIG. 8. FIG. 10 illustrates the insertion and removal assembly of FIG. 9 in a second position. FIG. 11 illustrates a partial internal view of an insertion and removal assembly in an enclosure for a rack mount type storage unit, according to one embodiment. The following discussion refers interchangeably to features FIGS. 1-11.

The insertion and removal assembly 600 may include a lever handle 602, having a pivot end 602a and a distal end 602b, a sliding member 604 having an upper end 604e and a lower end 604f, and an attachment wall 606 having a plurality of protrusions 608 defining a plurality of slots 610-614, each slot configured to receive a sliding member. Although three (3) slots 610-614 are shown, this is by way of example only. The attachment wall 606 may have more than three (3) slots or fewer than three (3) slots.

As shown in FIG. 6, each slot is defined by a first pair of protrusions and a second pair of protrusions, where the first pair of protrusions is offset from the second pair of protrusions. Each protrusion may include a first portion 608a extending perpendicularly from the attachment wall 606 and a second portion 608b integrally connected and perpendicular to the first portion forming a generally "L" shaped configuration.

The sliding member 604 may have a bottom 604a integrally connected to a first sidewall 604b, a second sidewall 604c and an end wall 604d forming a generally rectangular configuration. The first sidewall 604b may have a first end integrally connected to the end wall 604d and a second end extending beyond the length of the bottom 604a. The bottom may have a first length and the first sidewall may have a second length, where the second length is greater than the first length. The second sidewall may have a third length, where the third length shorter than the first length.

The second sidewall 604c may include one or more flexible support members 605 extending inwardly into the sliding member 604. The flexible support members 605 are configured for contacting and applying a specific force to a side of the data storage drive 631 forcing the data storage drive into the first sidewall 604b and securing the data storage drive 631 within the sliding member 606. That is, the flexible support members 605 may perform like a spring to push the data storage drive against the first sidewall 604b allowing for the slide member 604 to adjust to different widths of different data storage drives. (See FIG. 11)

The second end of the first sidewall 604b may include an elongated lever handle groove 616 for receiving a pivot pin 618 on the pivot end 602a of the lever handle 602 for rotatably connecting the lever handle 602 to the sliding member 604. The elongated lever handle groove 616 may extend in the horizontal direction relative to the vertical sidewalls 604b, 604c. In one aspect, the elongated lever handle groove 616 may have a generally oval configuration having a first groove end and a second groove end where the second groove end is larger than the first groove end. The pivot pin 618 may be rotatably engaged with the elongated lever handle groove 616 allowing the lever handle 602 to be movable between a first position (See FIG. 9) and a second position (See FIG. 10).

When in the first position, the lever handle 602 may be located perpendicularly to the sliding member 604 and a latching protrusion or hook 624 may extend outwardly from the distal end of the lever handle 602 into a latching hole 627 on an attachment wall securing the lever handle 602 to the attachment wall. That is, as the lever handle 602 is pushed downward, the latching hole 627, integrally formed in a top portion of the attachment wall, flexes away from the lever handle 602 and then back to capture the latching protrusion or hook 624 at the same end of the lever handle 602. The latching protrusion or hook 624 and the latching hole form a fastening mechanism.

The top portion of the attachment wall 606 may include a latching tab 626 near a distal portion of the lever handle 602 movable with a thumb or other finger of a user. Applying pressure to the latching tab 626 when the fastening mechanism is in the unlocked position causes the top portion of the attachment wall to flex outwards and then back capturing the latching protrusion within the latching hole 627. Furthermore, applying pressure to an adjacent tab of the attachment wall when the fastening mechanism is in the locked position causes the top portion of the attachment wall to flex outwards releasing the latching protrusion from the latching hole.

Once the fastening mechanism has been unlocked and the lever handle 602 springs outward, the user may pull the lever handle 602 outwardly to the second position (See FIG. 13) which in turn causes the sliding member 604 to slide outwards. If the slot houses a data storage drive 631, the user action of pulling the lever handle 602 to the second position causes the data storage drive to partially eject from the slot by a prescribed distance. The user may then grasp the data storage drive and remove the data storage drive from the slot.

To install a data storage drive, the lever handle 602 may be lifted to the second position and the data storage drive is inserted into the sliding member 604 and the associated data storage drive slot. Once the data storage drive has been completely received within the sliding member 604, the user may move the lever handle 602 from the second position to the first position (i.e. the lever handle 602 will be begin to close towards the hard drive) causing the sliding member 604 and the hard drive to be pushed further inward into the slot. In this continued motion, the hard drive will connect with a related data storage drive mating connector 628 located on a printed circuit board 629 within the enclosure until its motion is stopped by the connector 628 and the hard drive will no longer move. As shown in FIGS. 9-10, the sliding member 604 is movable between a first sliding position (See FIG. 9) and a second sliding position (See FIG. 10). When in the first sliding position, the end wall of the sliding member 604 may be located at a distance X from an end portion of the attachment wall 606. When in the second sliding position, the end wall of the sliding member 604 may be located at a distance Y from the end portion of the attachment wall 606, where Y is greater than X.

To facilitate movement of the sliding member 604, the bottom 604a of the sliding member may include a first pair of elongated grooves 620, extending perpendicularly to the end wall 604d, for receiving a first pair of protrusions and a second pair of elongated grooves 622, extending perpendicularly to the end wall 604d, for receiving a second pair of protrusions. The L shape of the protrusions provide for securing the sliding member 604 to the attachment wall 606 while allowing the sliding member to move between the first sliding position and the second sliding position.

According to one aspect, the lever handle 602 may include a curvature or concave groove which contacts and applies a specific force to a surface of the data storage drive 631. The data storage drive 631 may then be captured by the user continuing to push the lever handle 602 at a general location near the distal (or latching) end of the lever handle 602, until the latching tab 626, comprised of portion of the side wall of the slot, flexes away from the lever handle 602 and then back to capture the latching hook 624 at the same end of the lever handle 602.

As described previously, the spring force may accommodate for variations and differences in the length of the data storage drives. Applying the spring force to the data storage drive allows for the data storage device to maintain good contact between a drive connector located on the data storage device with a corresponding mating receptacle on a printed circuit board within the enclosure. Additionally, if the data storage drive is a rotational drive (i.e. a hard drive), the spring force applied by the lever handle 108 may reduce vibration within the drive which is a result of the disc rotation and the acceleration of the READ/WRITE Head armature. Vibration can cause the head to mis-track and when the head is knocked off-track it must retry the READ or WRITE operation which results in performance loss. Multiple retries cause very poor data throughput speeds and enough retries can cause the drive to fail.

Figure 12:
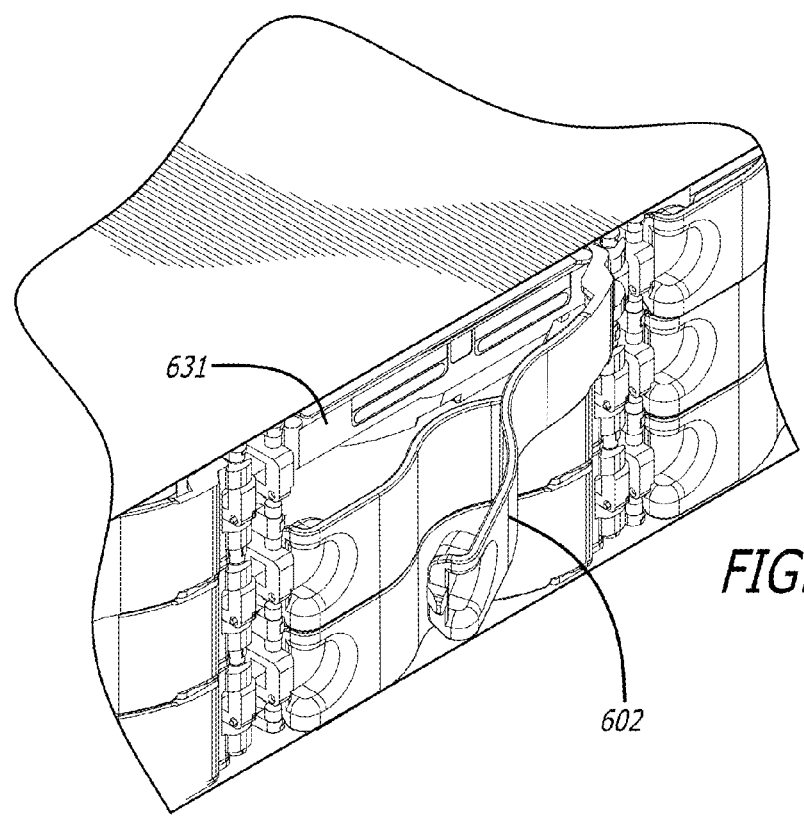
FIG. 12 illustrates a of stack hard drives located within an enclosure.
Figure 13:
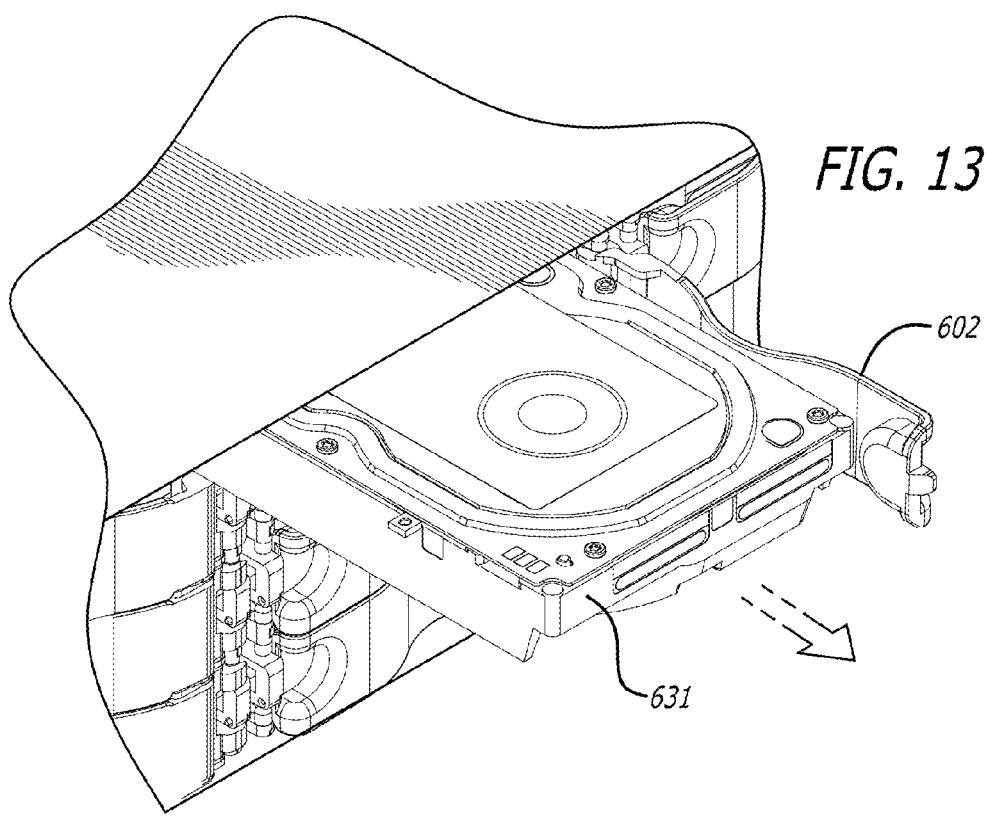
FIG. 13 illustrates a partially ejected hard drive from the stack of hard drives of FIG. 12.

FIG. 12 illustrates a stack of hard drives located within an enclosure and FIG. 13 illustrates a partially ejected hard drive from the stack of hard drives of FIG. 12.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. An insertion and removal assembly for installing and removing components from an enclosure, comprising:
   at least one sliding member, having an upper member end and a lower member end, configured to receive a computer component, the at least one sliding member comprising:
      a bottom having a first length extending from a first bottom end and a second bottom end opposite the first bottom end;
      a first sidewall having a second length extending from a first lower end to a first top end, the second length greater than the first length;
      a second sidewall having a third length extending from a second lower end to a second top end, the third length shorter than the first length; and
      an end plate, wherein the bottom, the first sidewall, the second sidewall and the end plate being integrally connected; and
   at least one lever handle having a pivot end and a distal end, the pivot end rotatably connected to the first top end of the first sidewall; and
   an attachment wall having a plurality of protrusions defining a plurality of slots, each slot configured to receive one sliding member from the at least one sliding member;
   where the at least one sliding member is moveable between a first sliding position and a second sliding position.

2. The assembly of claim 1, wherein each slot on the attachment wall is defined by a first pair of protrusions in the plurality of protrusions and a second pair of protrusions in the plurality of protrusions.

3. The assembly of claim 2, wherein the first pair of protrusions is offset from the second pair of protrusions.

4. The assembly of claim 1, wherein the first top end of the first sidewall has an elongated lever handle groove adapted to receive a pivot pin located on the pivot end of the lever handle, the pivot pin adapted to rotate with the lever handle from a first position to a second position.

5. The assembly of claim 4, wherein the bottom includes a first pair of elongated grooves adapted to receive the first pair of protrusions and a second pair of elongated grooves adapted to receive the second pair of protrusions.

6. The assembly of claim 5, wherein each protrusion in the first pair of elongated protrusions and the second pair of elongated protrusions has a first portion extending perpendicularly outward from the attachment wall and a second portion extending perpendicularly outward from the first portion, parallel to the attachment wall.

7. The assembly of claim 6, wherein the end wall of the sliding member is located a first distance from a bottom portion of the attachment wall when in the first sliding position;
  wherein the end wall of the sliding member is located a second distance from the bottom portion of the attachment wall when in the second sliding position; and
  wherein the second distance is greater than the first distance.

8. The assembly of claim 1, further comprising a fastening mechanism operable between a locked position and an unlocked position, the fastening mechanism comprising:
  a latching protrusion integrally connected to and extending outwardly from the distal end of the at least one lever handle; and
  a latching hole integrally formed within a top portion of the attachment wall and adapted to capture the latching protrusion when in the locked position.

9. The assembly of claim 8, wherein the top portion of the attachment wall includes a latching tab extending above the latching hole;
  wherein applying pressure to the latching tab when the fastening mechanism is in the unlocked position causes the top portion of the attachment wall to flex outwards and then back capturing the latching protrusion within the latching hole; and
  wherein applying pressure to an adjacent tab on the top portion of the attachment wall when the fastening mechanism is in the locked position causes the top portion of the attachment wall to flex outwards releasing the latching protrusion from the latching hole.

10. The assembly of claim 9, wherein pressing the adjacent tab of the attachment wall when the fastening mechanism is in the locked position causes the at least one lever handle to spring outward.

11. The assembly of claim 10, wherein rotating the at least one lever handle causes the sliding member to move from the first sliding position to the second sliding position.

12. The assembly of claim 11, wherein when the sliding member is in the second sliding position, the computer component is partially ejected.

13. The assembly of claim 9, wherein moving the lever handle from the second position to the first position causes the sliding member to slide inward into a slot.

14. The assembly of claim 1, wherein the computer component is a data storage drive.

15. The assembly of claim 1, wherein the at least one lever handle has a curvature for contacting and applying a specific force to a surface of the computer component.

16. The assembly of claim 1, wherein the first top end the first sidewall of the at least one sliding member extends beyond the bottom of the at least one sliding member.

17. An enclosure for a storage unit, comprising:
  a bottom plate;
  a pair of side plates;
  a pair of end plates, the bottom plate, the pair of side plates and the pair of end plates being integrally connected;
  one or more printed circuit boards connected to and extending perpendicularly from at least one of the bottom plate, the pair of side plates and the pair of end plates;
  one or more insertion and removal assemblies, for installing and removing components from the enclosure, connected to and extending perpendicularly from the one or more circuit boards, each of the one or more insertion and removal assemblies comprising:
    at least one sliding member, having an upper member end and a lower member end, configured to receive a computer component, the at least one sliding member comprising:
      a bottom having a first length extending from a first bottom end and a second bottom end opposite the first bottom end;
      a first sidewall having a second length extending from a first lower end to a first top end, the second length greater than the first length;
      a second sidewall having a third length extending from a second lower end to a second top end, the third length shorter than the first length; and
      an end plate, wherein the bottom, the first sidewall, the second sidewall and the end plate being integrally connected; and
    at least one lever handle having a pivot end and a distal end, the pivot end rotatably connected to the first top end of the first sidewall; and
    an attachment wall having a plurality of protrusions defining a plurality of slots, each slot configured to receive one sliding member from the at least one sliding member;
    where the at least one sliding member is moveable between a first sliding position and a second sliding position.

18. The enclosure of claim 17, wherein each slot on the attachment wall is defined by a first pair of protrusions in the plurality of protrusions and a second pair of protrusions in the plurality of protrusions.

19. The enclosure of claim 18, wherein the first top end of the first sidewall has an elongated lever handle groove adapted to receive a pivot pin located on the pivot end of the at least one lever handle, the pivot pin adapted to rotate the at least one lever handle from a first position to a second position;
  wherein the bottom includes a first pair of elongated grooves adapted to receive the first pair of protrusions and a second pair of elongated grooves adapted to receive the second pair of protrusions; and
  wherein each protrusion in the first pair of elongated protrusions and the second pair of elongated protrusions has a first portion extending perpendicularly outward from the attachment wall and a second portion extending perpendicularly outward from the first portion, parallel to the attachment wall.

20. The enclosure of claim 19, wherein the at least one sliding member further comprises a fastening mechanism operable between a locked position and an unlocked position, the fastening mechanism comprising:
  a latching protrusion integrally connected to and extending outwardly from the distal end of the at least one lever handle; and
  a latching hole integrally formed within a top portion of the attachment wall and adapted to capture the latching protrusion when in the locked position.

21. The enclosure of claim 20, wherein the top portion of the attachment wall includes a latching tab extending above the latching hole;
  wherein applying pressure to the latching tab when the fastening mechanism is in the unlocked position causes the top portion of the attachment wall to flex outwards and then back capturing the latching protrusion within the latching hole; and
  wherein applying pressure to an adjacent tab on the top portion of the attachment wall when the fastening mechanism is in the locked position causes the top portion of the attachment wall to flex outwards releasing the latching protrusion from the latching hole.

22. The enclosure of claim 17, wherein the at least one lever handle has a curvature for contacting and applying a specific force to a surface of the computer component.

* * * * *